United States Patent [19]
Koizumi

[11] Patent Number: 5,504,707
[45] Date of Patent: Apr. 2, 1996

[54] SEMICONDUCTOR DEVICE

[75] Inventor: Haruo Koizumi, Kawasaki, Japan

[73] Assignee: Fujitsu Limited, Kawasaki

[21] Appl. No.: 306,979

[22] Filed: Sep. 16, 1994

[30] Foreign Application Priority Data

Sep. 17, 1993 [JP] Japan .................................. 5-231616

[51] Int. Cl.$^6$ .............................. G11C 11/34; G11C 7/00
[52] U.S. Cl. .................. 365/185.04; 365/185.05; 365/185.26; 365/185.14; 257/316
[58] Field of Search ..................... 365/185, 900, 365/189.01, 49, 63, 218, 51; 257/315

[56] References Cited

U.S. PATENT DOCUMENTS

4,964,078 10/1990 Jandu et al. ............................ 365/185
4,998,223 3/1991 Akaogi .................................... 365/185
5,172,342 12/1992 Gochi ..................................... 365/226
5,280,451 1/1994 Akaogi ................................... 365/185

*Primary Examiner*—Tan T. Nguyen
*Attorney, Agent, or Firm*—Armstrong, Westerman, Hattori, McLeland & Naughton

[57] ABSTRACT

The present invention provides a semiconductor device in which an EEPROM and an OTPROM are mounted on the same chip, a single power supply system is used, and both ROMS can be effectively used. Such a semiconductor device has the EEPROM region and the OTPROM region arranged on the same chip, and a control device which makes only the prescribed cell in either region of both regions EEPROM and OTPROM regions active.

7 Claims, 6 Drawing Sheets

SEMICONDUCTOR DEVICE

BACKGROUND OF THE INVENTION

1. Field of the Invention

The present invention relates to a semiconductor device and in detail, it relates to a semiconductor device in which a ROM (EEPROM), having a capability to electrically write and erase information in the prescribed storage means, and a ROM (OTPROM), having a capability to electrically write information in the prescribed storage means only one time and no capability to erase, are mixed.

2. Description of the Related Art

Hitherto, semiconductor devices containing a ROM (EEPROM), having capability to electrically write and erase information in the prescribed storage means, and semiconductor devices containing a ROM (OTPROM), having capability to electrically write information in the prescribed storage means only one time and no capability to erase, have been used individually and generally.

However, with the increasing complexity of information processing systems in recent years, plural semiconductor elements having different functions respectively are mounted on the same chip. This allows downsizing the chip, increasing the number of functions, reducing the manufacturing cost and the like.

For example, in many cases, an EEPROM for storing the prescribed program for a microcomputer is contained in one chip, while a OTPROM in which data such as the ID of the used device, that is, information about the manufacturer's serial number, manufacture date and the like, is contained in another chip.

However, since the voltages used for writing and reading information, etc. are different in an EEPROM and in an OTPROM, only an EEPROM or an OTPROM is mounted on a chip (system-on-chip) in many cases, therefore, conventional devices have a defect in that the manufacturing process is made complicated and manufacturing cost is increased.

Although the defect can be dealt with by using a multi-power-supply system in which the EEPROM and the OTPROM are simultaneously mounted on the same chip but the power supplies are individually constituted, this method also has a defect in that the manufacturing process is complicated and the manufacturing cost is increased.

In an ordinary method, the many of the data processing operation can be carried out only with EEPROMs.

However, recently, since it has been required that a lots of amount of information should be processed and registered in memories in a short period, many cases have necessarily been occurred in which the processed information should be stored in OTPROM.

For example, a serial number of a chip can be registered in the read-only-memory having a capability to electrically write and erase information in a storage means (EEPROM) but it can be rewritten by an user of the chip.

Accordingly, in such a situation, even when the user of the chip wishes to check the history of the chip utilizing the serial number, when the chip is malfunctioned, a high reliability about the serial number of the chip stored in the EEPROM, cannot be obtained.

On the other hand, the reliability about data written into the stored in the OTPROM is much higher than that stored in the EEPROM, since the data once stored in the OTPROM is not theoretically erased and thus the data representing the operational conditions of the chip can be sequentially stored in the OTPROM.

Therefore, when the reasons about the malfunction of the chip is analysed, the operational histories of the chip having a high reliability, can be easily obtained.

Thus, it has been required to use a chip on which the EEPROM and the OTPROM are simultaneously provided on the same chip.

However, it has been considered to be difficult that the EEPROM and the OTPROM are simultaneously existed on the same chip. Accordingly, the present invention is to provide a means for resolving the above-mentioned problem.

SUMMARY OF THE INVENTION

An object of the present invention is to provide a semiconductor device in which the problems in prior art are solved, the EEPROM and the OTOROM are mounted on the same chip, a single power supply system is used, both the devices can be effectively used, and the manufacturing cost can be reduced.

In order to achieve the above-mentioned purpose, the present invention adopts the basic technical constitution described below. That is, a semiconductor device in which a least one first cell structure, at least one second cell structure and a control means for controlling both cell structures, are arranged in the same chip, and wherein said first cell structure has a floating gate and has a capability to electrically write and erase information in a storage means when said control means is connected thereto to thereby extract electric charge injected into said floating gate therefrom, while said second cell structure has a capability to electrically write information in a storage means only one time, but no capability to erase same. More precisely, a semiconductor device in which the EEPROM region and the OTPROM region are arranged in the same chip and a control means to drive only the prescribed cell in one of the two regions is provided. More concretely, in the semiconductor device having basic constitution mentioned above, the device is constituted so that the cell structure arranged in the EEPROM region is same as the cell structure arranged in the OTPROM region, or a direction of inputting electrons into and outputting electrons from the cell structure arranged in the EEPROM region and a direction of inputting electrons into and outputting electrons from the cell structure arranged in the OTPROM region are opposite to each other.

Since the semiconductor device of the present invention has the technical constitution, mentioned above, where a region having the EEPROM function and a region having the OTPROM function are arranged on the same chip, a single power supply means is used, and the cell structure of the EEPROM region and the cell structure of the OTPROM region can be selectively driven, it is possible to downsize the chip, increase the number of functions, and reduce the manufacturing costs.

In accordance with the another technical conception of the present invention, the present invention is to provide the semiconductor device in which the cell structures in the device are formed by the EEPROMs and a part of the EEPROMs are not connected to a data erasing circuit so as to serve the part of the EEPROMs as the OTPROMs to thereby enable to write data therein but not to enable to erase data stored therein.

According to this embodiment, it is not required to prepare a separate electric power source and a production line to produce this chip will be simplified since the cells formed on the same chip can be easily classified into either the EEPROMs or the OTPROMs by simply selecting a connecting line to be arranged among the circuits.

DETAILED DESCRIPTION OF THE PREFERRED EMBODIMENT

Hereinafter, embodiments of the semiconductor device relating to the present invention are described in detail by referring the drawings.

Figure 1:
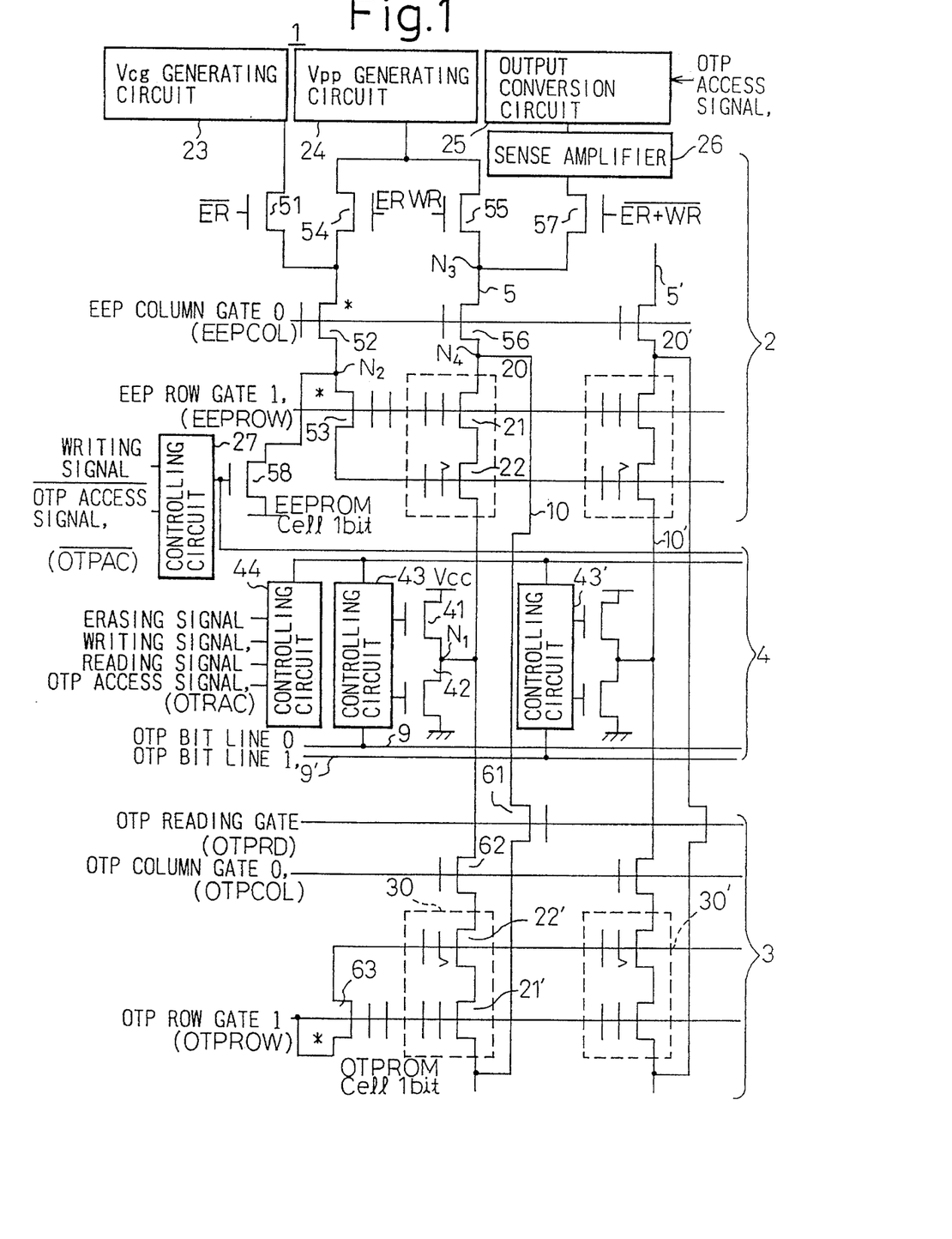
FIG. 1 is a block diagram showing the constitution of one embodiment of the semiconductor device of the present invention.

FIG. 1 is a block diagram for explaining the constitution of one embodiment of the semiconductor device of the present invention, and shows a semiconductor device 1 in which a first region 2, on that at least one first cell structure having a capability to electrically write and erase information in a storage means, for example EEPROM, is formed and a second region 3 on that at least one second cell structure having a capability to electrically write information in a storage means only one time, but no capability to erase same is formed, for example OTPROM, are arranged in the same chip and a control means 4, which makes only the prescribed cell in one of the two regions active, is provided. More precisely a semiconductor device 1 in which an EEPROM region 2 and an OTPROM region 3 are arranged in the same chip and a control means 4, for driving only the prescribed cells 20 formed in the first region 2 and the cells 30 formed in the second region 3, is provided.

In the semiconductor device 1 relating to the present invention shown in FIG. 1, said control means 4 is arranged between the EEPROM region 2 and the OTPROM region 3 and the control means allows either the cell structures 20 of the EEPROM region 2 or the cell structures 30 of the OTPROM region 3 to perform reading, writing and erasing information operations.

Furthermore, it goes without saying that operation for writing information into the cell structures 30 of the OTPROM region 3 is performed only one time and the operation for erasing information electrically is not performed.

Also, the explanation of the embodiment mentioned above is given for a pair of bit lines 5, 5' among the plural bit lines provided in the semiconductor device 1 as a matter of convenience and on the assumption that another pair of bit lines have the same constitution.

Further, it is desirable that the constitution of the cell structure 20 arranged in the EEPROM region 2 used in the semiconductor device 1 relating to the present invention is same as the constitution of the cell structure 30 arranged in the OTPROM region 3.

By adopting such constitution, the manufacturing process of the semiconductor device can be simplified and the cost reduced.

One example of the constitution of the cell structures 20 and 30 in the present invention is shown in FIG. 1. In the example an N channel type thick film enhancement type transistor 21 is arranged in series with an N channel type tunnel transistor 22 in which information can be stored.

Further, another characteristic structure in the semiconductor device 1 relating to the present information is as follows.

The device is constituted so that direction of electrons to be inputted into and outputted from the cell structures 20 relating to operation for writing and reading information in each cell structures 20 arranged in the EEPROM region 2 and direction of the electron to be inputted into and outputted from the cell structures 30 relating to operation for writing and reading information in each cell structures 30 arranged in the OTPROM region 3 are opposite direction each other.

Further, in the semiconductor device 1 relating to the present invention, each cell structure 20 arranged in the EEPROM region 2 and the cell structure 30 arranged in the OTPROM region 3 are connected to a common bit line 5.

Also, in the semiconductor device 1 relating to the present invention, each cell structure 20' arranged in the EEPROM region 2 and the cell structure 30' arranged in the OTPROM region 3 are connected to a common bit line 5'.

Next, the constitution of a control means 4 and a control system in the EEPROM region 2 and the OTPROM region 3 in the semiconductor device 1 relating to the present invention is explained.

That is, the control means 4 in the present invention is connected to a bit line 5 and one cell structure 20 of the above-mentioned EEPROM region 2 and one cell structure 30 of the OTPROM region 3 are commonly connected to the bit line 5. It is also desirable that the control means 4 is connected between the cell structures in the EEPROM region 2 and the cell structures 30 in the OTPROM region 3.

In the control means 4, for example, N channel type enhancement type transistors 41 and 42 are connected in series, and the connecting node section N1 is connected to the above-mentioned bit line 5 and the other end terminal of the N channel type enhancement type transistor 41 is connected to a power supply section Vcc having a prescribed voltage, for example, 5V. The other end terminal of the N channel type enhancement type transistor 42 is connected to a power supply section having the prescribed voltage, for example, GND.

On the other hand, the control means 4 is provided with the first control circuits 43 and 43' having control terminal sections connected to gate sections of the N channel type enhancement type transistors 41 and 42, while a second control circuit 44 is also provided to which an erasing signal ER, a writing signal WR, a reading signal RD and an OTP access signal OTPAC mentioned later, and the like are input thereto and which controls the first control means 43 in response to each one of the control signals.

Furthermore, in the above-mentioned embodiments, one end terminal of the first control circuit 43 is connected to an OTP bit line 9, and one end terminal of the first control circuit 43' is connected to an OTP bit line 9'.

One example of a control system of the EEPROM region 2 in the present invention will be explained referring FIG. 1. For example, the EEPROM region 2 is provided with a control gate voltage (Vcg) generating circuit 23, a bit line voltage (Vpp) generating circuit 24, an output conversion circuit 25 which switches output data between the EEPROM region and the OTPROM region, a sense amplifier 26, and the third control circuit 27 to which a writing signal WR and an inverted OTPAC signal (bar OTPAC signal) are input and which controls the state of a control circuit connecting the control gate voltage generating circuit 23 and the cell structure 20.

In the embodiment in the present invention, first, one end terminal of a control gate line 8 connecting the control gate voltage (Vcg) generating circuit 23 and the cell structure 20 is connected to the control gate voltage generating circuit 23 as illustrated, and the control gate line 8 is constituted by an N channel type enhancement type transistor 51 to which an inverted erasing signal ($\overline{ER}$) is input, an N channel type depletion type transistor 52 to which an EEP column gate signal (EEPCOL) is input, and an N channel type thick film depletion type transistor 53 to which an EEP row gate signal (EEPROW) signal is input, the transistors being arranged in the above-mentioned order in series, and the other end part of the N channel type thick film depletion type transistor 53 is connected to a gate of an N channel type thick film enhancement type transistor 22 in the cell structure 20.

Also, a control output terminal of the third control circuit 27 is connected to a gate of an N channel type enhancement type transistor 58 of which one end terminal is connected to a connecting node section N2 of the N channel type depletion type transistor 52 and the N channel type thick depletion type transistor 53 and the other end terminal is connected to GND.

The above-mentioned EEP row gate signal is input to a gate of the other N channel type thick film enhancement type transistor 21 constituting the cell structure 20, as is evident from FIG. 1.

The bit line voltage (Vpp) generating circuit 24 of the embodiment of the present invention is connected to the bit line 5 connected to the cell structure 20, and the bit line 5 is constituted so that one end of the bit line 5 is connected to the bit line voltage (Vpp) generating circuit 24, to an N channel type enhancement type transistor 55 to which the writing signal (WR) is input in a gate and to an N channel type enhancement type transistor 56 to which the EEP column gate signal (EEPCOL) is input in a gate are arranged in series, and one end part of the N channel type enhancement type transistor 56 is connected to the other end of the N channel type thick film enhancement type transistor 21 of the cell structure 20.

A control output terminal of the bit line voltage (Vpp) generating circuit 24 is connected to one end of the N channel type depletion type transistor 52 on the above-mentioned control gate line 8 via an N channel type enhancement type transistor 54 to which the erasing signal ER is input.

The output conversion circuit 25 in the present invention receives the above-mentioned OTP access signal OTPAC, while its output is input to a sense amplifier 26 and an output of the sense amplifier 26 is applied to a connecting node section N3 of the N channel type enhancement type transistors 55 and 56 on the bit line 5 via an N channel type enhancement type transistor 57 to which a NAND signal (/(ER+WR)) of the erasing signal ER and the writing signal WR is input.

An example of circuit constitution in the OTPROM region 3 of the semiconductor device 1 in the present invention will now be explained. As mentioned above, the cell structure 30 in the OTPROM region 3 has the same constitution as the cell structure 20 provided in the EEPROM region 2, and it is constituted so that an N channel type tunnel transistor 22' and an N channel type thick film enhancement type transistor 21' are connected in series in this order starting from the control means 4.

Concretely, one end of the N channel type tunnel transistor 22 is connected to the bit line 5 extending from the control means 4 via an N channel type enhancement type transistor 62 to which the OTP column gate signal (OTPCOL) is input.

Further, the row gate signal (OTPROW) is input to a gate of the N channel type thick film enhancement type transistor 21', while one end of the N channel type thick film depletion type transistor 63 to which the OTP row gate signal (OTPROW) is input is connected to a gate of the N channel type tunnel transistor 22' and the other end of the N channel type thick film depletion type transistor 63 is connected to a gate of the N channel type thick film depletion type transistor 63.

In the present invention, an open end of the N channel type thick film enhancement type transistor 21' constituting the cell structure 30 in the OTPROM region 3 and a connecting node part N4 of the N channel type thick film enhancement type transistor 21 constituting the cell structure 20 in the EEPROM region 2 and the N channel type enhancement type transistor 56 are appropriately connected by a wiring 10 and, at an intermediate point, the N channel type enhancement type transistor 61, to which an OTP reading gate signal (OTPRD) is input, is provided.

Next, one example of operation in the above-mentioned embodiment is explained.

The control gate voltage (Vcg) generating circuit 23 in the above-mentioned embodiment generates a control gate voltage (Vcg) for a data storage cell and it can generate power supply voltages of 20V, 2V, and 0V in accordance with the kind of operation.

Further, the bit line voltage (Vpp) generating circuit 24 generates voltage for bit lines 5, 5', for example, it can generate a power supply voltage of 20V.

The sense amplifier 26 is a conventional sense amplifier, and has a function of reading out a value of the data storage cell. The output conversion circuit 25 selects switches data from the EEPROM or the OTPROM, and the first the control circuit 43, the second control circuit 44 and the third control circuit 27 control erasing, writing and reading respectively.

The EEPROM cell 20 is selected by the EEP column gate (EEPCOL) and the EEP row gate (EEPROW), and the OTPROM cell 30 is selected by OTP column gate (OTPCOL) and the OTP row gate (OTPROW).

Also, the device is constituted that a source level of the data storage cell is controlled by OTP bit lines 9, 9' and is connected to the sense amplifier.

That is, in the present invention, as shown in FIG. 1, it is constituted so that the EEPROM is operated ordinarily and, when the OTP access signal (OTPAC) is input, a one time writing and an ordinary reading operation in the OTPROM region can be performed.

In the present invention, a memory means having a plurality the cells having the same structure as to each other is provided on the same chip and a single power supply means is provided so as to selectively use, one of functions of the EEPROM and the OTPROM the operations of which are different to each other. In order to realize the above-mentioned operations, as shown in the above-mentioned constitution, it is characterized that the cell structure arranged in the EEPROM region and the cell structure arranged in the OTPROM region are connected to the common bit line, while it is required that a driving method of the cell structure 20 arranged in the EEPROM region 2 and a driving method of the cell structure 30 arranged in the OTPROM region 3 are substantially opposite.

It is desirable to constitute the embodiment so that a direction the electrons to be input into and the electrons to be output from the cell structure, arranged in the EEPROM region and a direction of the electrons to be input into and the electrons to be output from the cell structure arranged in the OTPROM region are opposite direction, to each other.

That is, in the above-mentioned embodiment, when the OTPROM region is made active by the OTP access signal (OTPAC), a stored data value shows inverted data stored in the EEPROM region. For example, when writing data in one of the regions carried out by injecting electrons into the cells erasing data is carried out by injecting electrons into the cells in the other region.

Figure 2A:
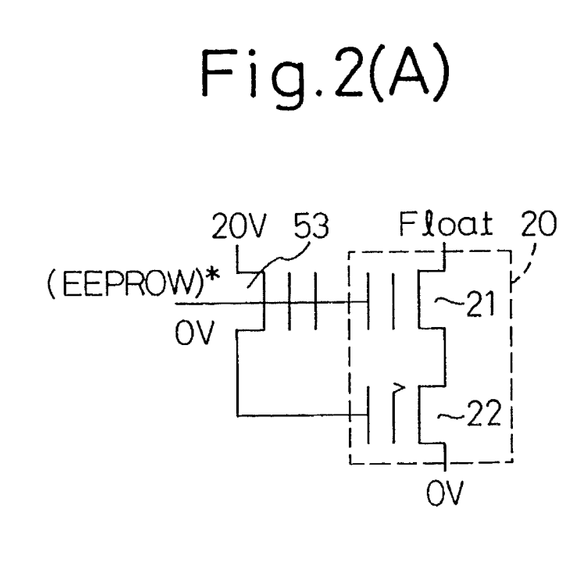
FIGS. 2(A) to 2(C) are block diagrams explaining the operation of the cell structure of the EEPROM region in the semiconductor device of the present invention.
Figure 2B:
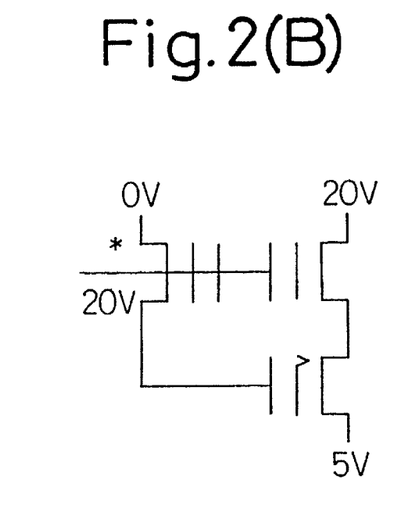
Figure 2C:
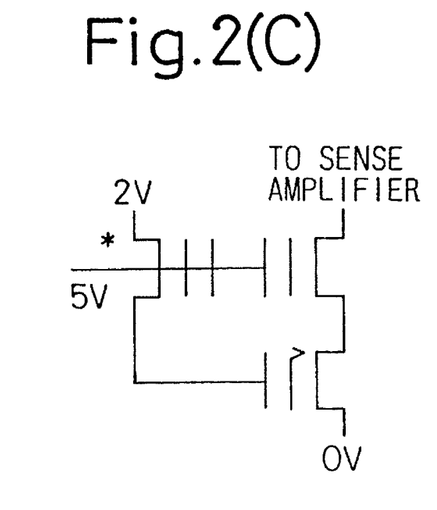
Figure 3A:
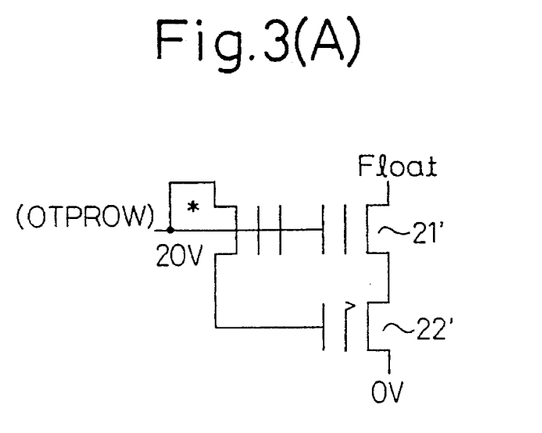
FIGS. 3(A) to 3(B) are block diagrams explaining the operation of the cell structure of the OTPROM region in the semiconductor device of the present invention.
Figure 3B:
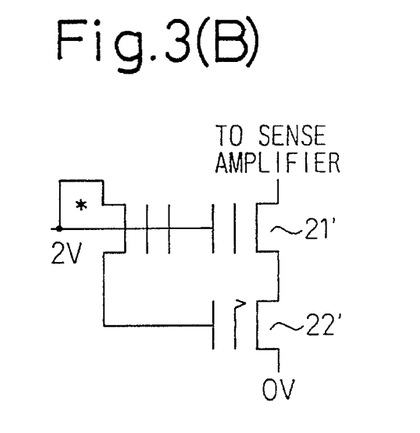

FIG. 2(A) to FIG. 2(C) are drawings which show examples of the operation of the cell structure in the EEPROM region in the above-mentioned embodiment of the present invention, and FIG. 3(A) to FIG. 3(B) are drawings which show examples of the operation of the cell structure in the OTPROM region in the above-mentioned embodiment of the present invention.

That is, in the embodiment in FIG. 1, when information stored in the cell structure 20 is erased, at the same time as the erasing signal (ER) is input to the prescribed terminal shown in FIG. 1, a potential at one end of the N channel type thick film depletion type transistor 53 connected to the bit line voltage (Vpp) generating circuit 24 is set to 20V, the EEP column gate (EEPCOL) is set to 0V, and the N channel type thick film depletion type transistor 52 is turned ON.

Further, the N channel type thick film depletion type transistor 53 is also turned ON.

On the other hand, the first control means 43 in the control means 4 turns the N channel type enhancement type transistor 41 OFF, the N channel type enhancement type transistor 42 is turned ON, and the bit lines 5, 5' are set to 0V.

Furthermore, in such erasing operation, as shown in FIG. 2(A), since the OTP reading gate (OTPRD) is at a low level and the N channel type enhancement type transistor 61 is in the OFF state, the OTPROM region is completely separated from the EEPROM.

Since a end of the N channel type thick film enhancement type transistor 21 in the cell structure 20 of the EEPROM region 2 is in a floating state and the end of the N channel type tunnel transistor 22 is set at 0V, electrons are injected into the N channel type tunnel transistor 22 and the information stored in the transistor 22 is erased.

In writing to the EEPROM region, as shown in FIG. 2(B), at the same time as the writing signal (WR) is input to the prescribed terminal shown in FIG. 1, the potential at one end of the N channel type thick film depletion type transistor 53, connected to the control gate voltage (Vcg) generating circuit 23, is set to 0V, and the EEP column gate (EEPCOL) is set to 20V.

A voltage of 20V is output from the bit line voltage (Vpp), and the voltage is applied to one end of the N channel type thick film enhancement type transistor 21 of the cell structure 20 via the N channel type enhancement type transistors 55 and 56.

On the other hand, the N channel type tunnel transistor 22 is in the OFF state.

The first control means 43 in the control means 4 turns the N channel type enhancement type transistor 41 ON and the N channel type enhancement type transistor 42 OFF, and sets the end of the bit liens 5, 5' to 5V.

In this writing operation too, the OTPROM region is completely separated from the EEPROM region.

When electrons are emitted from the N channel type tunnel transistor 22 in the cell structure 20 of the EEPROM region 2, the prescribed information is stored in the transistor 22 and writing operation is completed.

In reading from the EEPROM region 2, as shown in FIG. 2(C), the read signal (RD) is input to the prescribed terminal as shown in FIG. 1, that is, to a gate of the N channel type enhancement type transistor 57, the bit lines 5, 5' are connected to the sense amplifier 26, and the potential at one end of the N channel type thick film depletion type transistor 53 connected to the control gate voltage (Vcg) generating circuit 23 is set to 2V and the EEP column gate (EEPCOL) is set to 5V.

Further, the first control means 43 in the control means 4 turns the N channel type enhancement type transistor 41 OFF and turns the N channel type enhancement type transistor 42 ON, and the end of the bit lines 5, 5' are set to 0V.

In the same way, the OTPROM region again completely separated from the EEPROM.

An electric charge stored in the N channel type tunnel transistor 22 in the cell structure 20 of the EEPROM region 2 is sensed via the sense amplifier 26.

Next, the operation of the cell structure in the OTPROM region in the present invention is explained referring to FIG. 3(A) and FIG. 3(B). First, when the cell structure 30 of the OTPROM region is operated and the above-mentioned OTP access signal (OTPAC) is input to the prescribed terminal shown in FIG. 1, a signal to drive the N channel type enhancement type transistor 58 is output from the third control circuit 27, therefore, the connection formed between a gate of the N channel type tunnel transistor 22, constituting the cell structure 20 of the EEPROM region 2 and the control gate line 8 is completely separated, thereby the EEPROM region 2 is separated from the OTPROM region 3.

The output conversion circuit 25 is switched so as to handle data in the cell structure 30 of the OTPROM region 3 by inputting the OTP access signal (OTPAC).

Further, in the reading operation, since an OTP read signal (OTPRD) is input to an OTP read gate shown in FIG. 1, as mentioned above, an N channel type enhancement type transistor 61 provided at an intermediate point in the wiring 10 connecting the cell structure 20 of the EEPROM region 2 and the cell structure 30 of the OTPROM region 3 is turned ON, and the cell structure 30 of the OTPROM region 3 is connected to the sense amplifier 26.

That is, the cell structure 30 of the OTPROM region 3 and the cell structure 20 of the EEPROM region 2 are individually connected to the sense amplifier 26, in this constitution.

When a writing operation is performed in the constitution shown in FIG. 3(A), the potential of the OTP row gate (OTPROW) is set to 20V, the N channel type tunnel transistor 22' and the N channel type thick film enhancement type transistor 21' are turned ON state together and the voltage of the OTP column gate is made high and the N channel type enhancement type transistor 62 is turned on.

On the other hand, the first control means 43 in the control means 4 turns the N channel type enhancement type transistor 41 OFF, the N channel type enhancement type transistor 42 is turned ON, and the end of the bit lines 5, 5' are set to 0V.

Since an end part of the N channel type thick film enhancement type transistor 21' in the cell structure 30 of the EEPROM region 3 is floating and the end of the N channel type tunnel transistor 22 is set to 0V, electrons are injected into the N channel type tunnel transistor 22 and the prescribed information is stored in the transistor 22.

When a reading operation is performed, as shown in FIG. 3(B), the potential of the OTP row gate (OTPROW) is set to 2V, the N channel type tunnel transistor 22' and the N channel type thick film enhancement type transistor 21' are both turned ON and the N channel type enhancement type transistor 61-providing at an intermediate point of the wiring 10 connecting the cell structure 20 of the EEPROM region 2 and the cell structure 30 of the OTPROM region 3 is turned ON by setting the potential of the OTP reading gate (OTPCOL) to a high level.

Consequently, an electric charge held in the N channel type tunnel transistor 22' is sensed via the sense amplifier 26.

The constitution of the cell structure 20 or 30 used in the present invention is as mentioned above. And an example of a two layer poly silicon gate type EEPROM is shown. However, the present invention is not restricted to such a constitution but, as shown in FIG. 4(A), it is possible that the N channel type N channel type thick film depletion type transistor 53 of which a gate is connected to the EEP row gate (EEPROW) is omitted and a gate of the N channel type tunnel transistor 22 is directly connected to the EEP row gate, and it is possible that the N channel type thick film enhancement type transistor 21 is omitted and the cell structure is constituted with only the N channel type tunnel transistor 22 of which a gate is connected to the EEP row gate.

Figure 4A:
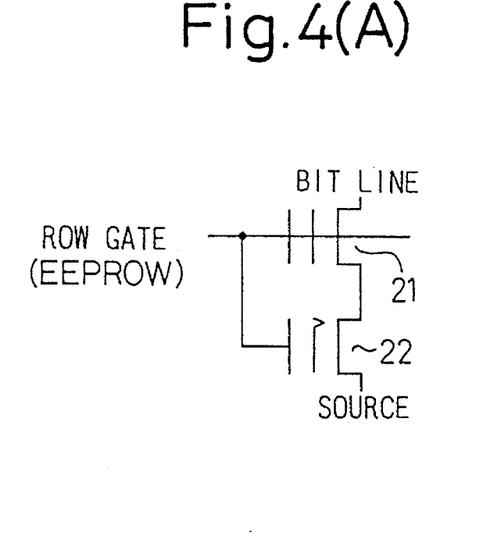
FIGS. 4(A) and 4(B) are block diagrams showing another constitution of the cell structure used in the present invention.
Figure 4B:
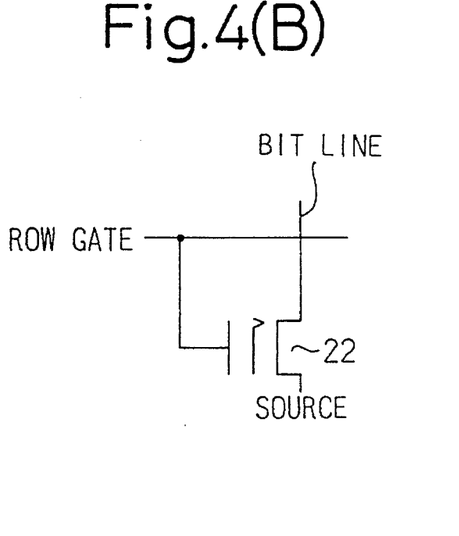

"S" shows a source in FIGS. 4(A) and (B). Examples of another constitution of the cell structure relating to the present invention are explained in FIG. 5(A)–(C), and an example using a one-layer poly-silicon gate type EEPROM is shown.

Figure 5A:
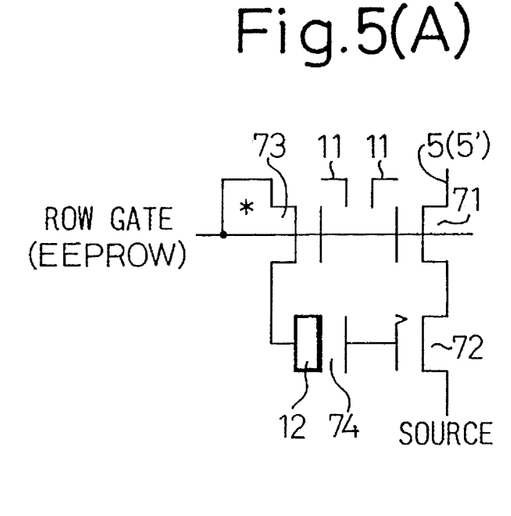
FIGS. 5(A) to 5(C) are block diagrams showing another constitution of the cell structure used in the present invention.

That is, in FIG. 5(A), the cell structure is constituted so that the N channel type enhancement type offset transistor 71 and the N channel type tunnel transistor 72, which have offset regions 11 for bit lines 5, 5', are connected in series, the EEP row gate is connected to a gate of the N channel type enhancement type offset transistor 71, while the N channel type depletion type transistor 73 having the offset region 11 and which has a gate connected to the EEP row gate, is connected to the EEP row gate. Further the source of the transistor 73 is commonly connected to the EEP row gate.

Further, it is constituted so that an N channel type enhancement type transistor 74 having a capacitor 12 is connected between a drain of the transistor 73 and the N channel type tunnel transistor 72.

Figure 5B:
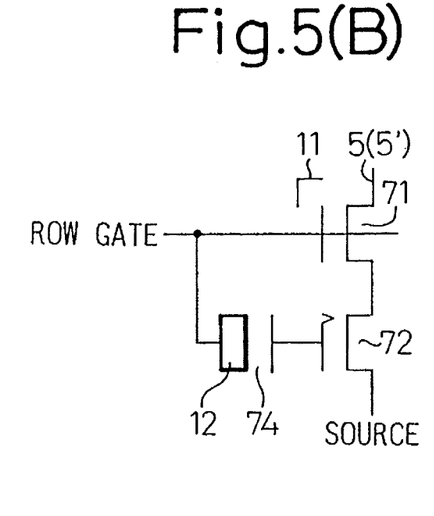
Figure 5C:
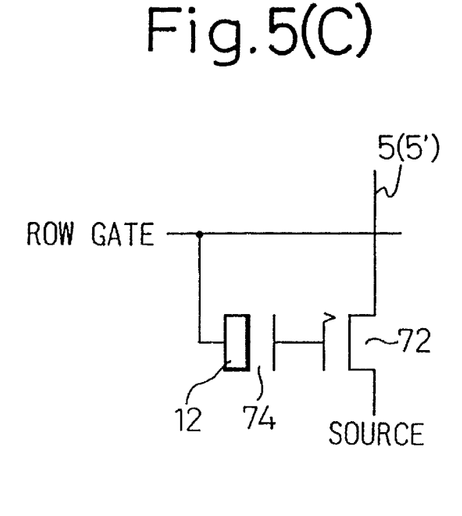

Also, a cell structure to which the cell structure shown in FIG. 4(A) can be simplified is shown in FIG. 5(B), and it is constituted so that the N channel type depletion type transistor 73 is omitted, and in FIG. 5(C), the N channel type enhancement type offset transistor 71 is also omitted.

Figure 6A:
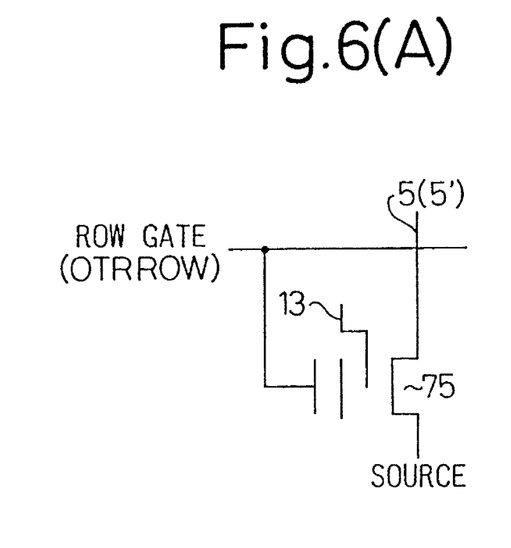
FIGS. 6(A) to 6(C) are block diagrams showing another constitution example in which the cell structure of the EEPROM used in the present invention is used as the OTPROM.
Figure 6B:
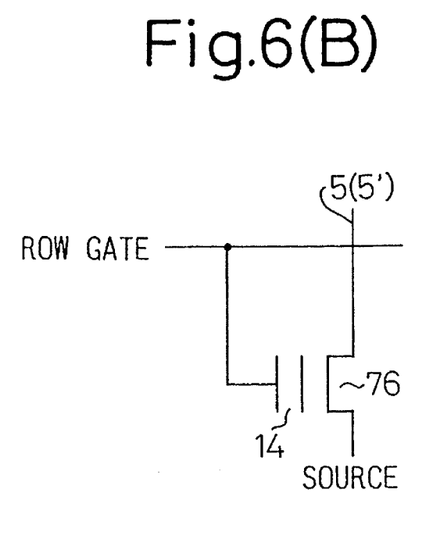
Figure 6C:
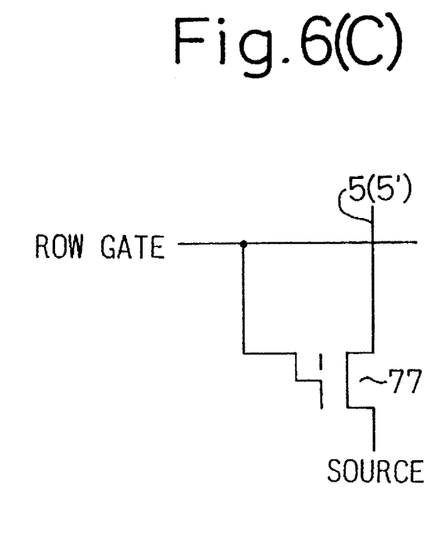

In FIG. 6(A) to FIG. 6(C), examples of another constitution of the cell structure relating to the present invention are explained, and an example of the cell structure of the OTPROM constituted by a flash type EEPROM is shown.

That is, in FIG. 6(A), a flash type EEPROM transistor 75, having an erasing gate 13 between the bit lines 5, 5' and the source, is provided and the gate of the transistor 75 is connected to the OTP row gate (OTPROW). In FIG. 6(B), a floating gate type EEPROM transistor 76 having a floating gate 14 is shown instead of the transistor 75.

Further, in FIG. 6(C), a drain tunnel effect type flash EPROM transistor 77 is provided instead of the transistor 75.

In the semiconductor device relating to the present invention, since signal levels at each node mentioned above are at various levels depending on structure of the EEPROM, levels of each node in each operation are set appropriately to suit the EEPROM.

An EEPROM cell such as a MNOS type EEPROM, a TEXTURED-POLY type EEPROM and the like can be used as the OTPROM cell. Further, in the present invention, in the second cell structure, the histories of the respective operations of said device are stored. And moreover in the second cell structure, the serially arranged information about the device, is stored.

Since the semiconductor device 1 of the present invention has the above-mentioned technical constitution, an OTPROM and an EEPROM can be mounted on one chip and since a single power supply means is used and either of the cell structures of the EEPROM region and the OTPROM region can be arbitrarily, selectively and independently driven, the chip can be downsized the number of function can be increased and the manufacturing cost can be reduced.

I claim:

1. A semiconductor device, comprising:

at least one first cell structure;

at least one second cell structure; and a control means for controlling both cell structures, wherein said at least one first cell structure, said at least one second cell structure and said control means are arranged in the same chip, wherein said first cell structure has a floating gate and has a capability to electrically write and erase information in a storage means when said control means is connected thereto to thereby extract electric charge injected into said floating gate therefrom, wherein said second cell structure has a capability to electrically write information in a storage means only one time, but is incapable of erasing said information electrically written in said storage means, wherein said first cell structure and said second cell structure have the same semiconductor structure, and wherein said control means carries out write and read controls for said first and second cell structures, and carries out erasure control for said first cell structure.

2. A semiconductor device according to claim 1, wherein said second cell structure stores histories of operations of said device.

3. A semiconductor device according to claim 1, wherein said second cell structure stores information, which is serially arranged, about the device.

4. A semiconductor device, comprising:

a first region on which at least one first cell structure having a capability to electrically write and erase information in a storage means is formed;

a second region on which at least one second cell structure having a capability to electrically write information in a storage means only one time is arranged with the at least one first cell structure in the same chip, wherein the at least one second cell is incapable of erasing the information electrically written in the storage means, and a control means for controlling the first and second cell structures, and for making active one of the first and second cell structures in one of the first and second regions, wherein said first cell structure and said second cell structure have the same semiconductor structure, and wherein said control means carries out write and read controls for said first and second cell structures, and carries out erasure control for said first cell structure.

5. A semiconductor device according to claim 4, wherein the cell structure arranged in said first region is same as the cell structure arranged in said second region.

6. A semiconductor device according to claim 4, wherein said device is constituted so that a direction of inputting electrons into and outputting electrons from the cell structure arranged in said first region and a direction of inputting electrons into and outputting electrons from the cell structure arranged in said second region, are opposite to each other.

7. A semiconductor device according to claim 4, wherein said cell structure arranged in said first region and said cell structure arranged in said second region are connected to a common bit line.

* * * * *